(12) United States Patent
Ono et al.

(10) Patent No.: US 12,445,140 B2
(45) Date of Patent: Oct. 14, 2025

(54) ANALOG SIGNAL GENERATION DEVICE AND CALIBRATION METHOD OF SAME

(71) Applicant: ANRITSU CORPORATION, Kanagawa (JP)

(72) Inventors: Hirofumi Ono, Kanagawa (JP); Koji Yamashita, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 99 days.

(21) Appl. No.: 18/616,665

(22) Filed: Mar. 26, 2024

(65) Prior Publication Data
US 2024/0340016 A1    Oct. 10, 2024

(30) Foreign Application Priority Data
Apr. 5, 2023   (JP) ................. 2023-061206

(51) Int. Cl.
*H03M 1/06* (2006.01)
*H03M 1/10* (2006.01)

(52) U.S. Cl.
CPC ....... *H03M 1/0607* (2013.01); *H03M 1/1014* (2013.01)

(58) Field of Classification Search
CPC .... H03M 1/0607; H03M 1/1014; H03M 1/66; H03M 1/1009
See application file for complete search history.

(56) References Cited

U.S. PATENT DOCUMENTS

| | | | |
|---|---|---|---|
| 8,081,096 B2* | 12/2011 | Kuramochi | H03M 1/1038 341/161 |
| 8,659,309 B2* | 2/2014 | Howe | G01R 31/3167 324/750.3 |
| 9,509,326 B1* | 11/2016 | Kauffman | H03M 1/1009 |

FOREIGN PATENT DOCUMENTS

JP    2022-109772 A    7/2022

* cited by examiner

*Primary Examiner* — Toan N Pham
(74) *Attorney, Agent, or Firm* — McDonald Hopkins LLC

(57) ABSTRACT

An analog signal generation device according to the present invention includes a DA converter that adjusts a signal level of a digital signal according to a DAC correction amount and then converts the digital signal into an analog signal, a detector that detects the analog signal and outputs a detection signal, a storage unit that stores a characteristic equation for calculating the DAC correction amount, and a control unit, in which in a case where the differential voltage when the digital signal having a signal level of a predetermined value is input to the DA converter is larger than a threshold value, the control unit calculates a new DAC correction amount based on the differential voltage by using the characteristic equation, and in a case where the differential voltage does not fall within the threshold value, the control unit corrects the characteristic equation.

4 Claims, 3 Drawing Sheets

ANALOG SIGNAL GENERATION DEVICE AND CALIBRATION METHOD OF SAME

TECHNICAL FIELD

The present disclosure relates to an analog signal generation device for generating a test signal and a calibration method of the same.

BACKGROUND ART

A signal generation device for generating a test signal for testing a mobile communication device is proposed (see, for example, Patent Document 1). The signal generation device disclosed in Patent Document 1 attenuates the power of a signal generated by a signal generation unit, and outputs a test signal. Patent Document 1 discloses a method of detecting the output power of a test signal by a level detection unit such as a detector, and adjusting a variable attenuation unit such that the output power becomes a desired power.

RELATED ART DOCUMENT

Patent Document

[Patent Document 1] JP-A-2022-109772

DISCLOSURE OF THE INVENTION

Problem that the Invention is to Solve

In the signal generation device disclosed in Patent Document 1, the control unit stores the slope of the characteristic of the level detection unit. Then, the control unit applies the power of the test signal detected by the level detection unit to the slope of the characteristic, and adjusts the variable attenuation unit to obtain the desired power. Note that the slope of the characteristic means the following. The level detection unit converts the signal power into a voltage, and the variation amount of the voltage with respect to the unit variation amount of the signal power for this conversion is defined as the "slope of the characteristic."

Here, the slope of the characteristic of the level detection unit varies depending on temperature, frequency, time, or the like. In a case where the slope of the characteristic of the level detection unit deviates from the slope of the characteristic stored in the control unit, there is a problem in that adjusting the power of the test signal requires a large number of trial and errors, making it difficult to make adjustments in a short time.

Therefore, in order to solve the above problems, an object of the present invention is to provide an analog signal generation device that can adjust the output power of a test signal to a desired value in a short time, and a calibration method of the same.

Means for Solving the Problem

In order to achieve the above object, an analog signal generation device according to the present invention is configured to correct the slope of the characteristic stored in the storage unit when the adjustment of the output power of the test signal (analog signal) is not completed within a predetermined number of times.

Specifically, the analog signal generation device according to claim 1 of the present invention includes:

a DA converter (4) that adjusts signal power of a digital signal according to a DAC correction amount and then converts the digital signal into an analog signal;

a detector (7) that detects the analog signal and outputs a detection signal;

a storage unit (9) that stores a characteristic equation for calculating the DAC correction amount based on a differential voltage between a detection voltage, which is a voltage of the detection signal, and a reference voltage; and a control unit (8) that calculates a new DAC correction amount based on the differential voltage by using the characteristic equation, in a case where the differential voltage when the digital signal having signal power of a predetermined value is input to the DA converter is larger than a threshold value, and returns the new DAC correction amount to an original DAC correction amount, and corrects the characteristic equation based on a relationship between the DAC correction amount for the differential voltage and a variation amount of the detection voltage, in a case where the differential voltage is larger than the threshold value even after calculating the new DAC correction amount a prescribed number of times.

The present analog signal generation device converts a digital signal of a constant level into an analog signal by using a DA converter. At this time, the DA converter sets the power of the analog signal according to the DAC correction value. Further, the present analog signal generation device also includes a detector that outputs the power of the analog signal as a detection voltage, and the control unit calculates a DAC correction value based on a characteristic equation such that the detection voltage becomes a predetermined voltage, and sets the DAC correction value in the DA converter.

Here, when the detection voltage does not fall within a predetermined voltage even after correcting the DAC correction value a predetermined number of times, the control unit determines that the characteristic equation for calculating the DAC correction value deviates from the current detector characteristic, and corrects the characteristic equation based on the correction amount when the DAC correction value is corrected and the behavior of the detection voltage. In other words, since the deviation between the slope of the characteristic of the detector and the slope of the characteristic stored in the control unit is corrected, it is possible to easily bring the detection voltage close to the predetermined voltage.

For example, as in the analog signal generation device according to claim 2 of the present invention, the control unit corrects the characteristic equation, when the characteristic equation is a linear expression, by setting a quotient obtained by dividing a value obtained by subtracting an immediately preceding detection voltage from a latest detection voltage, by an immediately preceding differential voltage, as a new slope.

Therefore, the present invention can provide an analog signal generation device that can adjust the output power of a test signal to a desired value in a short time.

A method according to claim 3 of the present invention is a calibration method of the analog signal generation device according to claim 1, the calibration method includes calculating a new DAC correction amount based on the differential voltage by using the characteristic equation, in a case where the differential voltage when the digital signal having signal power of a predetermined value is input to the DA converter is larger than a threshold value; and returning the new DAC correction amount to an original DAC correction amount, and correcting the characteristic equation based on a relationship between the DAC correction amount for the differential voltage and a variation amount of the detection voltage, in a case where the differential voltage is larger than the threshold value even after calculating the new DAC correction amount a prescribed number of times.

As described above, the present analog signal generation device can easily bring the detection voltage close to the predetermined voltage using the present calibration method.

For example, as in the calibration method according to claim 4 of the present invention, when the characteristic equation is a linear expression, the characteristic equation is corrected, by setting a quotient obtained by dividing a value obtained by subtracting an immediately preceding detection voltage from a latest detection voltage, by an immediately preceding differential voltage, as a new slope.

Therefore, the present invention can provide a calibration method that can adjust the output power of a test signal to a desired value in a short time.

The above inventions can be combined as much as possible.

Advantage of the Invention

The present invention can provide an analog signal generation device that can adjust the output power of a test signal to a desired value in a short time, and a calibration method of the same.

BEST MODE FOR CARRYING OUT THE INVENTION

Figure 1:
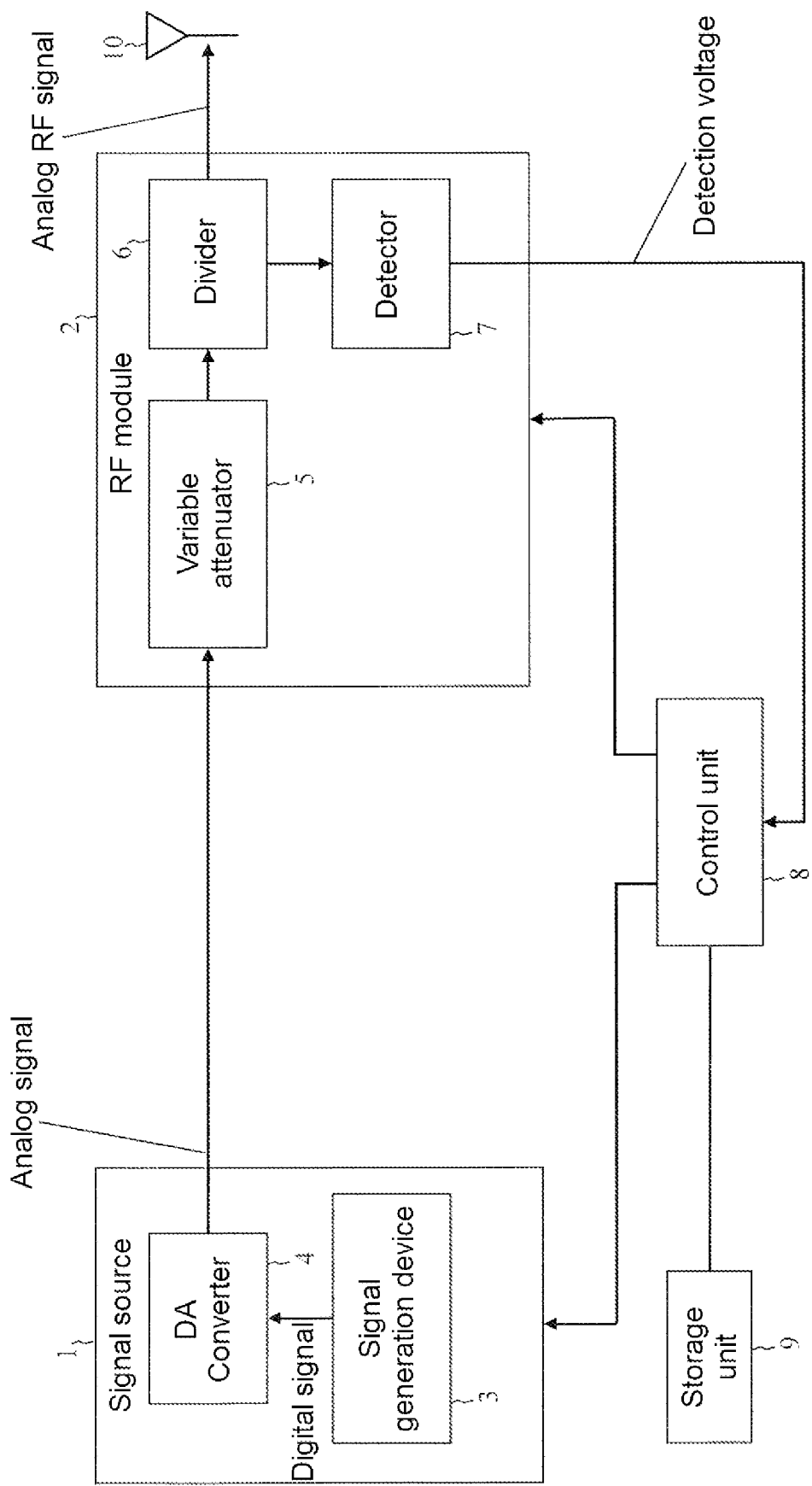
FIG. 1 is a diagram illustrating the configuration of an analog signal generation device according to the present invention.

Hereinafter, an embodiment of the present disclosure will be described in detail with reference to the drawings. The present disclosure is not limited to the embodiment described below. These implementation examples are merely illustrative, and the present disclosure can be implemented in various modified and improved forms based on the knowledge of those skilled in the art. In the present specification and the drawings, the components having the same reference numerals shall indicate the same components.

FIG. 1 is a diagram illustrating the configuration of an analog signal generation device according to the present embodiment. The present analog signal generation device includes a DA converter 4 that adjusts signal level of a digital signal according to a DAC correction amount and then converts the digital signal into an analog signal, a detector 7 that detects the analog signal and outputs a detection signal, a storage unit 9 that stores a characteristic equation for calculating the DAC correction amount based on a differential voltage between a detection voltage, which is a voltage of the detection signal, and a reference voltage, and a control unit 8 that calculates a new DAC correction amount based on the differential voltage by using the characteristic equation, in a case where the differential voltage when the digital signal having signal level of a predetermined value is input to the DA converter 4 is larger than a threshold value, and returns the new DAC correction amount to an original DAC correction amount, and corrects the characteristic equation based on a relationship between the DAC correction amount for the differential voltage and a variation amount of the detection voltage, in a case where the differential voltage is larger than the threshold value even after calculating the new DAC correction amount a prescribed number of times.

The signal source 1 includes a signal generation device 3 that generates a digital signal, and a DA converter 4 that converts the digital signal into an analog signal.

An RF module 2 up-converts the frequency of the analog signal to a radio frequency to convert the analog signal into an analog RF signal, and outputs the analog RF signal from the antenna 10 as a test signal for testing a mobile communication device. The RF module 2 includes a variable attenuator 5 that adjusts the amplitude (power) of the analog RF signal, a divider 6 that divides the power-adjusted analog RF signal, and a detector 7 that detects the divided analog RF signal and outputs the amplitude (power) of the analog RF signal as a detection voltage. The detector 7 corresponds to the level detection unit disclosed in Patent Document 1. In addition, the RF module 2 includes a circuit having a function of up-converting the frequency, and an amplifier in at least one of the front stage and the rear stage of the variable attenuator 5, which are not shown.

Figure 2:
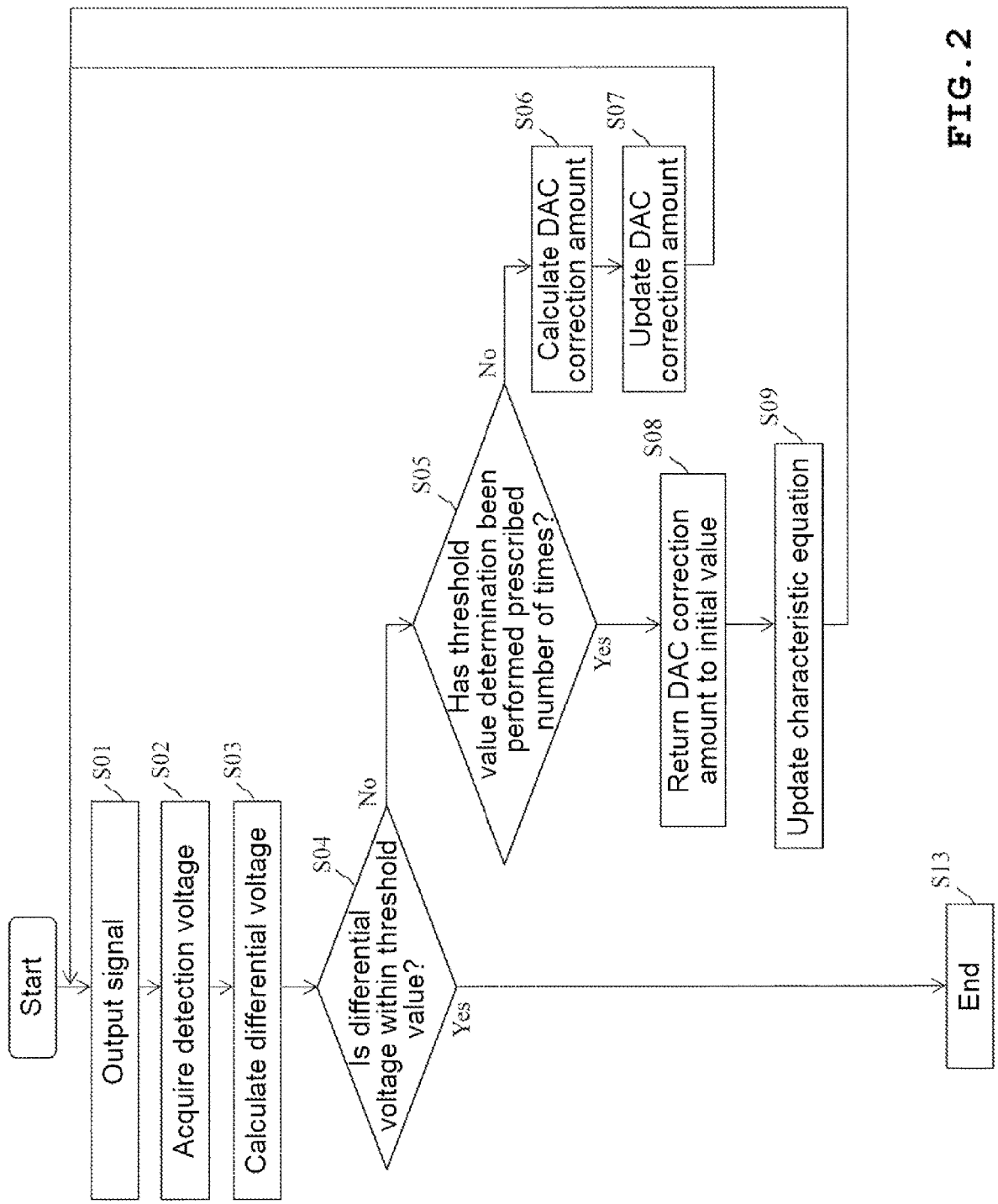
FIG. 2 is a diagram illustrating a calibration method according to the present invention.

FIG. 2 is a flowchart illustrating a calibration method performed by the control unit 8 on the DA converter 4.

First, in a case where the differential voltage when the digital signal of which signal power is a predetermined value is input to the DA converter 4 is larger than a threshold value, the control unit 8 calculates a new DAC correction amount based on the differential voltage by using the characteristic equation (steps S01 to S06).

Each Step Will be Explained Below.

Step S01:

The control unit 8 causes the signal source 1 to output a digital signal at a predetermined level. Note that during the present calibration, the predetermined level of the digital signal is constant and is not changed. The DA converter 4 converts the digital signal into an analog signal according to the DAC correction amount given from the control unit 8. Note that the DAC correction amount is an amount by which the amplitude (power) of the analog signal is varied to become a predetermined value. The analog signal is input to the RF module 2.

Step S02:

The RF module 2 uses a variable attenuator 5 to adjust the amplitude of the analog signal. Note that during the present calibration, the amount of attenuation in the variable attenuator 5 is constant and is not changed. The detector 7 outputs a detection voltage (V) corresponding to the amplitude of the analog signal divided by the divider 6.

Figure 3:
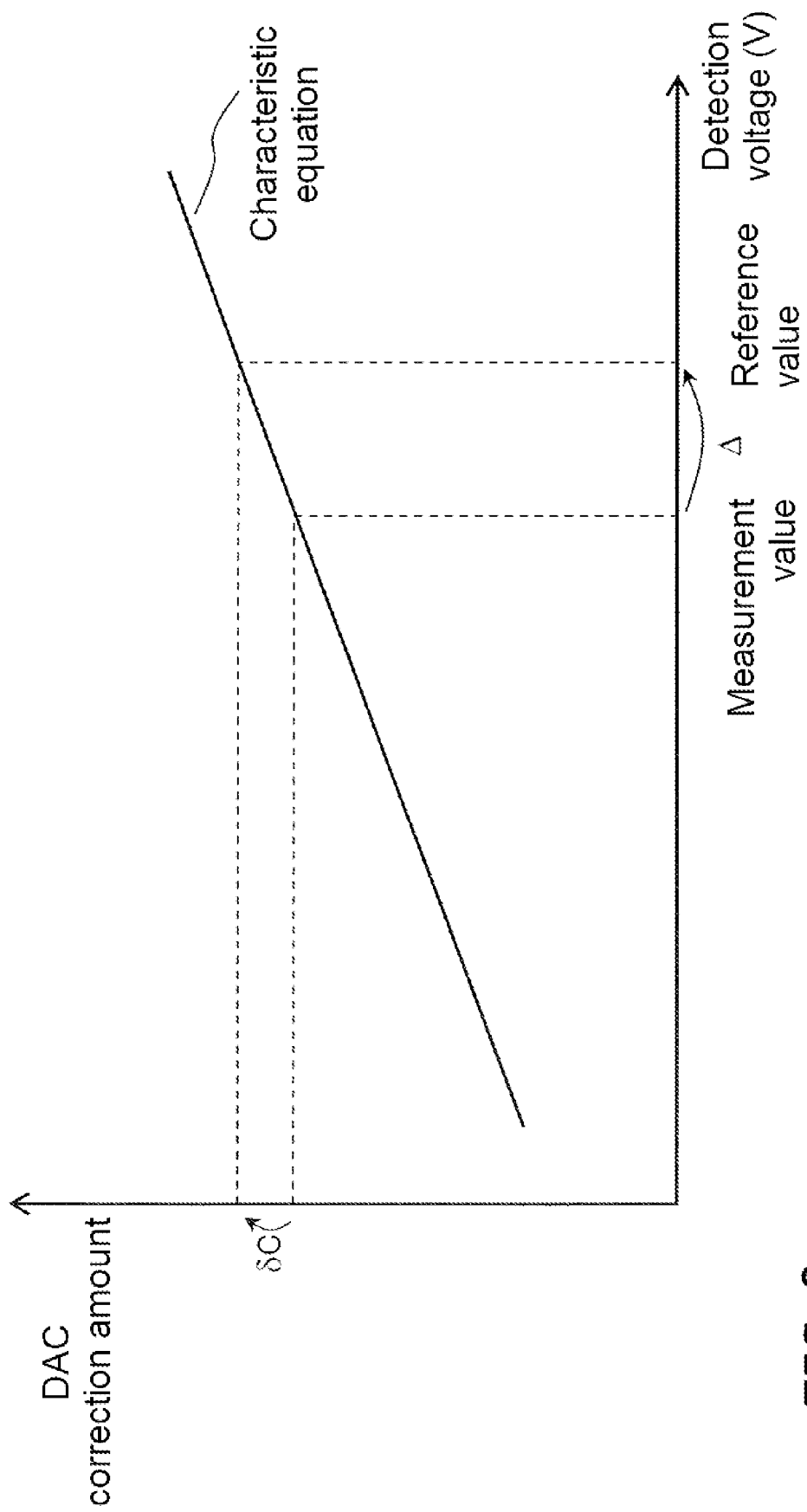
FIG. 3 is a diagram illustrating a characteristic equation.

Step S03:

The control unit 8 calculates the differential voltage 4 from the reference voltage, which is obtained from the characteristic equation stored in the storage unit 9 and the current DAC correction amount. FIG. 3 is an example of a characteristic equation stored in the storage unit 9.

Step S04:

The control unit 8 determines whether the differential voltage Δ is within a threshold value. When the differential voltage Δ is within the threshold value, the control unit 8 ends the calibration (step S13).

Step S05:

On the other hand, in a case where the differential voltage Δ does not fall within the threshold value, the control unit 8 determines whether or not the threshold value determination in step S04 has been performed a prescribed number of times.

Step S06:

In a case where the number of threshold value determinations in step S04 does not reach the prescribed number of times, the control unit 8 calculates the amount-to-be-corrected of the DAC correction amount based on the differential voltage 4 by using the above-described characteristic equation.

Step S07:

The control unit 8 corrects the current DAC correction amount using the calculated amount-to-be-corrected δC, and applies the corrected DAC correction amount to the DA converter 4 as a new DAC correction amount. Then, steps S01 to S07 are repeated again.

On the other hand, in a case where the differential voltage Δ is larger than the threshold value even after calculating the new DAC correction amount a prescribed number of times, the control unit 8 returns the new DAC correction amount to the original DAC correction amount, and corrects the characteristic equation based on a relationship between the DAC correction amount for the differential voltage Δ and a variation amount (amount-to-be-corrected) δC of the detection voltage (steps S08 to S11).

Each step will be explained below.

Step S08:

The control unit 8 first returns the current DAC correction amount to its initial value.

Step S09:

The control unit 8 calculates the slope of the characteristic equation based on the DAC correction amount and the differential voltage Δ obtained during calibration. This will be explained using a specific example.

The control unit 8 corrects the characteristic equation, when the characteristic equation is a linear expression, by setting a quotient obtained by dividing a value obtained by subtracting an immediately preceding detection voltage from a latest detection voltage, by an immediately preceding differential voltage Δ, as a new slope.

The prescribed number of times is set to 6 times. In other words, assume that the differential voltage Δ does not fall within the threshold value even after the DAC correction amount is updated five times.

Each differential voltage Δ is as follows.

differential voltage Δ(0) at the uncorrected DAC correction amount=−0.262V differential voltage Δ(1) at the DAC correction amount after first correction=0.183V differential voltage Δ(2) at the DAC correction amount after second correction=−0.117V differential voltage Δ (3) at the DAC correction amount after third correction=0.067V differential voltage Δ(4) at the DAC correction amount after fourth correction=−0.062V differential voltage Δ(5) at the DAC correction amount after fifth correction=0.054V The control unit 8 obtains the slope a of the characteristic equation, from the result of the calibration process in which a detection voltage Vd(5) is obtained by correcting the DAC correction amount for a differential voltage Δ(4) at the detection voltage Vd(4) at the DAC correction amount after the fourth correction.

$$a = (Vd(5) - Vd(4))/\Delta(4) \qquad (1)$$

Note that the control unit 8 may set to a, the average value of the slope calculated from the result of each correction time i.

$$a = \frac{1}{n}\sum_{i=1}^{n} \frac{Vd(i) - Vd(i-1)}{\Delta(i-1)} \qquad (2)$$

However, n is the number of times the threshold value determination is performed.

The control unit 8 stores the characteristic equation with the new slope a in the storage unit 9.

Step S10:

The control unit 8 calculates the DAC correction amount based on the latest differential voltage Δ(for example, Δ(5)) using the characteristic equation with the slope corrected, and applies the calculated DAC correction amount to the DA converter 4. Then, the detection voltage at this time is acquired.

Step S11:

The control unit 8 calculates the differential voltage Δ from the reference voltage, obtained from the latest characteristic equation stored in the storage unit 9 and the current DAC correction amount.

Step S12:

The control unit 8 determines whether the differential voltage Δ is within a threshold value. When the differential voltage Δ is within the threshold value, the control unit 8 ends the calibration (step S13). On the other hand, if the differential voltage Δ is not within the threshold value, the control unit 8 performs the operation from step S01 using a new characteristic equation.

Effect

The number of times the DA converter is adjusted until the differential voltage between the detection voltage and the reference voltage falls within the threshold value can be reduced (calibration time can be shortened).

INDUSTRIAL APPLICABILITY

The present disclosure can be applied to information communication industry.

DESCRIPTION OF REFERENCE NUMERALS AND SIGNS

1: Signal source
2: RF module
3: Signal generation device
4: DA converter
5: Variable attenuator
6: Divider
7: Detector 8: Control unit
9: Storage unit
10: Antenna

What is claimed is:

1. An analog signal generation device comprising:
a DA converter that adjusts signal power of a digital signal according to a DAC correction amount and then converts the digital signal into an analog signal;
a detector that detects the analog signal and outputs a detection signal;
a storage unit that stores a characteristic equation for calculating the DAC correction amount based on a differential voltage between a detection voltage, which is a voltage of the detection n signal, and a reference voltage; and
a control unit that calculates a new DAC correction amount based on the differential voltage by using the characteristic equation, in a case where the differential voltage when the digital signal having signal power of a predetermined value is input to the DA converter is larger than a threshold value, and returns the new DAC correction amount to an original DAC correction amount, and corrects the characteristic equation based on a relationship between the DAC correction amount for the differential voltage and a variation amount of the detection voltage, in a case where the differential voltage is larger than the threshold value even after calculating the new DAC correction amount a prescribed number of times.

2. The analog signal generation device according to claim 1, wherein
when the characteristic equation is a linear expression, the control unit corrects the characteristic equation, by setting a quotient obtained by dividing a value obtained by subtracting an immediately preceding detection voltage from a latest detection voltage, by an immediately preceding differential voltage, as a new slope.

3. A calibration method of an analog signal generation device including a DA converter that adjusts signal power of a digital signal according to a DAC correction amount and then converts the digital signal into an analog signal, a detector that detects the analog signal and outputs a detection signal, and a storage unit that stores a characteristic equation for calculating the DAC correction amount based on a differential voltage between a detection voltage, which is a voltage of the detection signal, and a reference voltage, the calibration method comprising:
calculating a new DAC correction amount based on the differential voltage by using the characteristic equation, in a case where the differential voltage when the digital signal having signal power of a predetermined value is input to the DA converter is larger than a threshold value; and
returning the new DAC correction amount to an original DAC correction amount, and correcting the characteristic equation based on a relationship between the DAC correction amount for the differential voltage and a variation amount of the detection voltage, in a case where the differential voltage is larger than the threshold value even after calculating the new DAC correction amount a prescribed number of times.

4. The calibration method according to claim 3, wherein
when the characteristic equation is a linear expression, the characteristic equation is corrected, by setting a quotient obtained by dividing a value obtained by subtracting an immediately preceding detection voltage from a latest detection voltage, by an immediately preceding differential voltage, as a new slope.

* * * * *